(12) United States Patent
Hesidenz et al.

(10) Patent No.: US 7,956,493 B2
(45) Date of Patent: Jun. 7, 2011

(54) INTEGRATED CIRCUIT AND METHOD FOR MANUFACTURING AN INTEGRATED CIRCUIT

(75) Inventors: Dirk Hesidenz, Sauerlach (DE); Markus Klaus Unger, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 282 days.

(21) Appl. No.: 12/189,549

(22) Filed: Aug. 11, 2008

(65) Prior Publication Data

US 2010/0033269 A1    Feb. 11, 2010

(51) Int. Cl.
*H02J 1/10* (2006.01)
*H04B 3/28* (2006.01)

(52) U.S. Cl. ............................................ 307/43; 333/12
(58) Field of Classification Search .................... 307/43; 333/1.2, 12, 1.1
See application file for complete search history.

(56) References Cited

U.S. PATENT DOCUMENTS

| | | | | |
|---|---|---|---|---|
| 5,689,179 | A * | 11/1997 | Walker | 323/283 |
| 5,847,451 | A * | 12/1998 | Ohtaki et al. | 257/697 |
| 7,046,084 | B2 * | 5/2006 | Araki et al. | 330/126 |
| 7,609,125 | B2 * | 10/2009 | van Quach et al. | 333/5 |

* cited by examiner

*Primary Examiner* — Michael Rutland Wallis
(74) *Attorney, Agent, or Firm* — Slater & Matsil, L.L.P.

(57) ABSTRACT

One or more embodiments of the invention relate to an integrated circuit including a first power supply domain and at least a second power supply domain. Furthermore, the integrated circuit includes a radio frequency element connected between the first power supply domain and the second power supply domain.

23 Claims, 5 Drawing Sheets

INTEGRATED CIRCUIT AND METHOD FOR MANUFACTURING AN INTEGRATED CIRCUIT

BACKGROUND

An integrated circuit can comprise more than one power supply domain. A microcontroller (μC), for example, may comprise different power supply domains. One power supply domain may be related to the voltage supply for the pads or the core of the microcontroller. Another power supply domain may be related to an analog module of the microcontroller. Such an analog module can be an analog-digital converter module, for example. In order to guarantee high accuracy of such an analog-digital converter a supply voltage for the power supply domain should be as smooth and quiescent as possible. Since the supply voltages of the other power supply domains of the microcontroller may comprise noise or other perturbations a quiescent power supply for the power supply domain of the analog-digital converter may be difficult to achieve.

Conventionally, the power supply domains of such an integrated circuit are either separated from each other or directly connected.

SUMMARY OF THE INVENTION

Embodiments of the invention relate to an integrated circuit with a first power supply domain and a second power supply, wherein a radio frequency (RF) decoupling element connects the first power supply domain and the second power supply domain.

DETAILED DESCRIPTION OF ILLUSTRATIVE EMBODIMENTS

With reference to FIGS. 1a to 4, embodiments are depicted, which relate to an integrated circuit comprising at least two different power supply domains, which are electrically connected by a radio frequency decoupling element and to a method of manufacturing an integrated circuit comprising same.

Figure 1A:
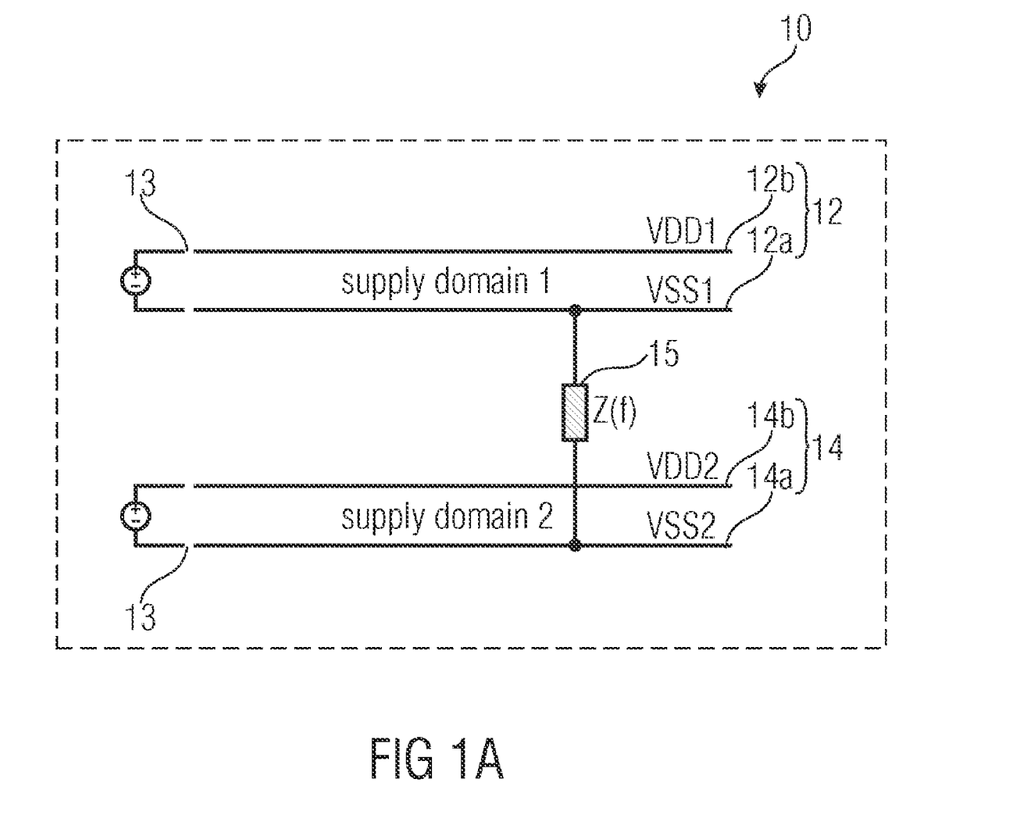
FIGS. 1a to 1c show schematic representations of integrated circuitry with frequency dependent inductive elements between various power supply domains, according to embodiments of the invention.

In FIG. 1a, a schematic representation of an integrated circuit (IC) according to an embodiment of the invention is depicted. In this embodiment, an integrated circuit 10 comprises a first power supply domain 12 and at least a second power supply domain 14. Furthermore the integrated circuit 10 includes a RF decoupling element 15, which is connected between the first power supply domain 12 and the second power supply domain 14.

The first power supply domain 12 may comprise a first portion 12a on a potential VSS1 and a second portion 12b on a potential VDD1. The second power supply domain 14 may comprise a third portion 14a on a potential VSS2 and a fourth portion 14b on a potential VDD2. The RF decoupling element may be connected, for example, between a portion 12a of the first power supply domain 12 and a portion 14a of the second power supply domain 14, which are one in the same potential. The RF decoupling element 15 can be an inductive element with a frequency dependent inductance Z(f). The portions 12a, 12b, 14a, 14b comprise in this schematic figure an interruption 13, indicating that the portions can be widely distributed across the integrated circuit 10.

By means of the RF decoupling element 15, connected between the first 12 and the second 14 power supply domain, the electrostatic discharge (ESD) robustness, as well as the electrical overstress (EOS) robustness of the integrated circuit 10 can be increased and furthermore a undesirable possible high frequency (HF) or noise coupling between the first 12 and the second 14 power supply domain can be avoided or reduced. This may be also important for integrated circuits with low operating voltages.

Figure 1B:
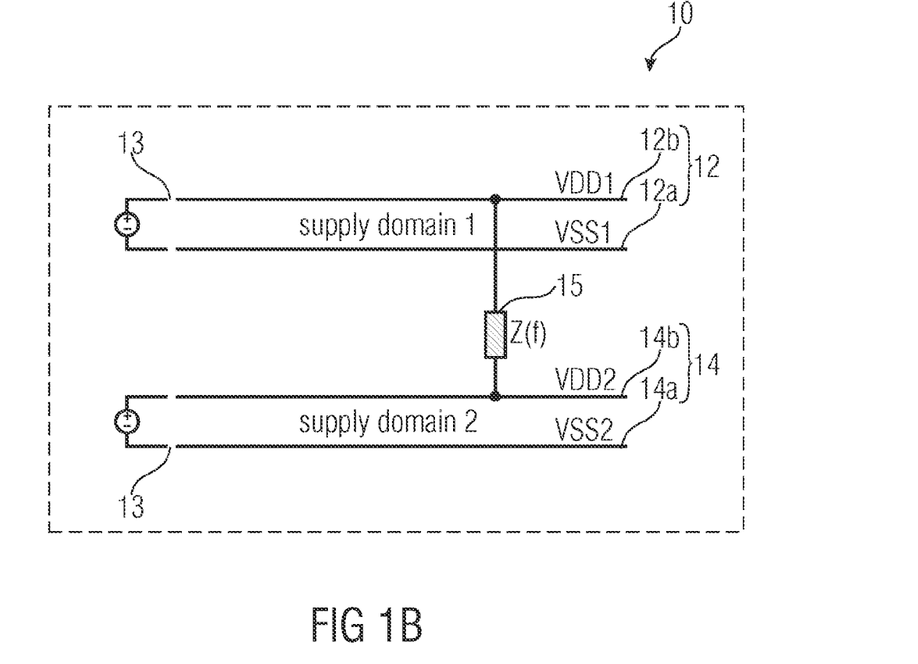

According to the embodiment in FIG. 1b, the RF decoupling element 15 of the integrated circuit 10 may be coupled between the second portion 12b of the first power supply domain 12 and the fourth portion 14b of the second power supply domain 14. The second portion 12b of the first power supply domain may be on a potential VDD1 and the fourth portion 14b of the second power domain 14 may be on the potential VDD2. This means that in this embodiment the RF coupling element 15 may be coupled between two portions of two different power supply domains, which may be on a potential VDD1 and VDD2, wherein the potential may be different, for example, to a ground potential. The second portion 12b and the fourth portion 14b may be on the same potential, e.g., VDD1 may be equal to VDD2.

Figure 1C:
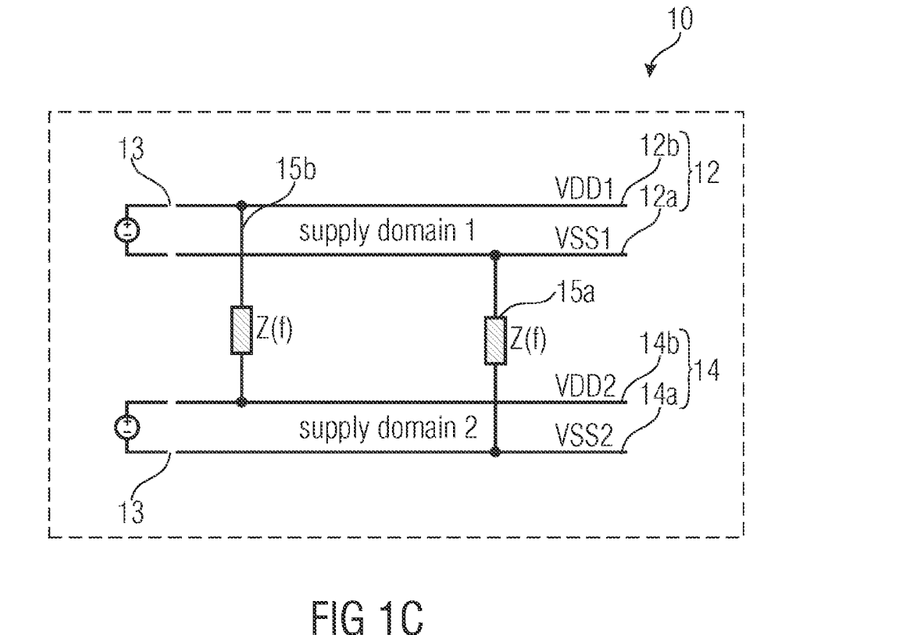

In the embodiment shown in FIG. 1c, the integrated circuit 10 may optionally comprise two RF decoupling elements 15a and 15b. The RF decoupling element 15a may be coupled between a first portion 12a of the first power supply domain 12 and a third portion 14a of the second power supply domain 14. Both portions 12 and 14a may be on the same potential. The potential may be a ground potential. The first portion 12a may be on the potential VSS1 and the third portion 14a may be on the potential VSS2. VSS2 may be equal to VSS1. In this embodiment of the invention a second RF decoupling element 15b may be connected between the second portion 12b of the first power supply domain 12 and the fourth portion 14b of the second power supply domain 14. The second portion 12b may comprise a potential VDD1 and the fourth portion 14b may comprise a potential VDD2. The potential VDD1 and the potential VDD2 may be equal, e.g., both are the same potentials. The potentials VDD1 and VDD2 may be different to a ground potential.

The RF decoupling element 15 may comprise a low pass characteristic. In other words the RF-decoupling element 15 may act as a low pass filter and hence, suppress higher frequency signals dependent on the inductance Z(f) of the RF decoupling element 15. The RF decoupling element 15 and accordingly 15a, 15b can be configured as an inductive element with a frequency dependent inductance Z(f). The inductance of the RF decoupling element coupled between two power supply domain portions, being on the same potential, may avoid or reduce a coupling of high frequency interferences between both power supply domains.

According to an embodiment a semiconductor die can comprise one or more integrated circuits with a plurality of different supply voltages and, hence, with a plurality of different power supply domains. The integrated circuit may be a microcontroller (μC), for example, with a plurality of power supply domains. One power supply domain may be related, for example, to the voltage supply for the pads of the microcontroller and another power supply domain may be related to an analog module. The analog module can be, for example, an analog-digital converter module on the microcontroller. A third power supply domain may be related to the core power supply of the microcontroller. A RF decoupling element may now be connected between portions of this three power supply domains, which are on a common ground potential or another common reference potential.

In another chip, for example, a dynamic random access memory chip (DRAM), a memory cell field may be fabricated within a process technology that is tolerating a different supply voltage as a logic circuitry on the DRAM chip. A first power supply domain may be designed, for example, for a 1.8V power supply voltage and a second power supply domain may be designed, for example, for a 3.3V power supply voltage. Each of the power supply domains may comprise again two portions. One portion of the first and the second power supply domain may be connected by a RF decoupling element, wherein the portions comprise the same potential.

A power supply domain may comprise a supply voltage, which is corresponding to the potential difference between the two portions of the power supply domain.

The RF decoupling element, which electrically connects a portion of a first power supply domain and a portion of a second power supply domain may be formed as a conductive path in a semiconductor device layer of an integrated circuit. The semiconductor device layer may be a metal layer or a poly-silicon layer, for example. The impedance of the conductive path is frequency-dependent, following the formula for the impedance: $X = 2\pi \times f \times L$ (with: $X=$: impedance, $f=$: frequency, $L=$: inductance). This means that the RF decoupling element, formed, e.g., as a conductive path or by line portions in a metal layer may comprise a low impedance for a direct current (DC), respectively for a low frequency signal and a high impedance for a high frequency signal.

A signal may be, for example, considered to be low frequency up to a frequency of 3 MHz and accordingly at frequencies higher than 3 MHz as high frequency. According to another embodiment of the invention, frequencies higher than 1 GHz are considered to be high frequency and below this limit as low frequency. In other embodiments of the invention, however, this differentiation may be different.

According to embodiments of the invention the RF decoupling element may be formed as an inductive element, which is electrically connecting a portion of the first power supply domain and a portion of the second power supply domain being on the same potential. This inductive element may be integrated in a chip package of the integrated circuit. The inductive element may comprise an inductance, which is coupled between a first and a second power supply domain of the integrated circuit.

By choosing the length and the exact geometry of the RF decoupling element, which may be formed as a conductive path, the impedance and the inductance between the two power supply domains can be adjusted.

In some embodiments of the invention the inductance of the RF decoupling element may depend on the exact manufacturing technology and a respective ESD clamp margin. In other words, the inductance to be chosen for a RF decoupling element 15 may depend on the margin between an ESD element and a parasitic punch-through for the manufacturing technology in which the integrated circuit 10 is formed. Because of the adjustable RF decoupling element connected between the power supply domains, the electrostatic discharge (ESD) robustness, as well as the electrical overstress (EOS) robustness of the integrated circuit can be increased and furthermore an undesirable high frequency coupling between the different power domains can be reduced.

By the RF decoupling element, which is coupled between a portion of the first power domain and a portion of the second power domain being on the same potential, a low impedant electrical connection can be achieved for a direct current (DC) or for a low frequency signal between the two power supply domains. This is important for the ESD and EOS strength of the integrated circuit.

The RF decoupling element may comprise an impedance higher than a shortest possible line, line portion or conductive path between the first power supply domain and the second power supply domain would have. In other words, the RF decoupling element can be formed by a conductive path, wherein the length of the conductive path is longer than a shortest possible conductive path between a portion of the first power supply domain and a portion of the second power supply domain would have. The length of the conductive path, which is forming the RF decoupling element, may comprise, for example, a length, which is longer than an automated layout or routing tool would suggest as the shortest possible conductive path between the power supply domains. The RF decoupling element is coupled, for example, between portions of different power supply domains of an IC, being on a ground potential or generally between portions of different power supply domains, which are on the same potential.

In embodiments of the invention the RF decoupling element may be formed by a line, line portion or a conductive path. Since the inductance L depends on the length and the geometry of the conductive path, the impedance of the RF decoupling element can be exactly tuned. The RF decoupling element may form a low impedance connection for a direct current or for a low frequency current between the different power supply domains. This is desirable in order to increase the electrostatic discharge (ESD) robustness, as well as the electrical overstress (EOS) robustness of the integrated circuit. The RF decoupling element may also form a high impedant electrical connection for high frequency interferences or noise between the different power supply domains and may therefore block interferences or noise from one power supply domain to another. As a consequence, high frequency interferences or general noise from power supply domains with distortions are not or only weakly coupled to other power supply domains.

An integrated circuit may, for example, include a power supply domain with voltage spikes or other perturbations, which should not be coupled to another power supply domain of the IC, which is very sensitive as far as the smoothness and quiescent of the supply voltage is concerned. A RF decoupling element, which is connected between those two power supply domains, may now be able to decouple noise of the disturbed power supply domain from the sensitive power supply domain.

An analog module, e.g., an analog-digital converter may, for example, comprise such a sensitive power supply domain. In order to achieve good accuracy in such analog modules, they need a power domain with a smooth and quiescent supply voltage. If such an analog module is integrated, for example, in a microcontroller, there may be a problem, since the microcontroller may comprise, for example, core and pad power domains. Such core and pad power supply domains may have a disturbed voltage supply. Since the same may be coupled, among others, to the sensitive power supply domain of the analog module a quiescent voltage supply for the analog module may be difficult to achieve. By connecting the RF decoupling between portions of the core power supply domain, the pad power supply domain and the power supply domain of the analog module, which are on the same potential, a quiescent, undisturbed voltage supply for the analog module may be improved.

Figure 2A:
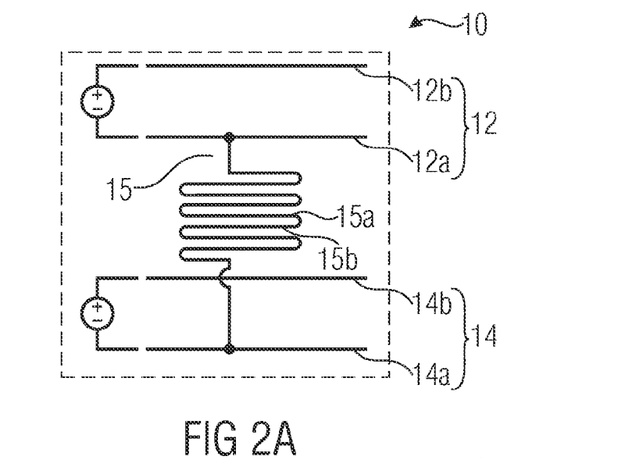
FIGS. 2a to 2c show different embodiments of an integrated circuit with a RF decoupling element connected between a first power supply domain and a second power supply domain of the integrated circuit.
Figure 2B:
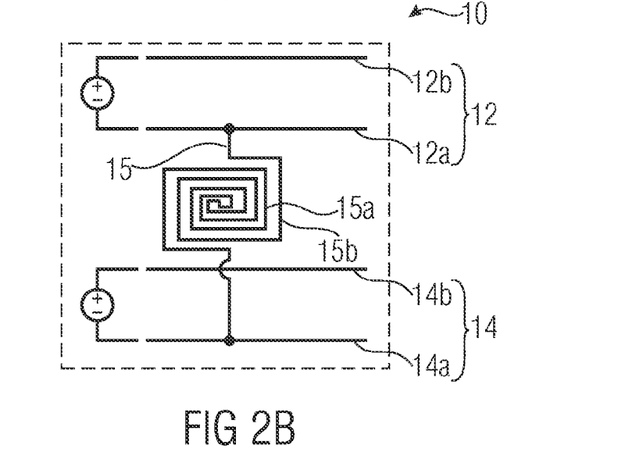
Figure 2C:
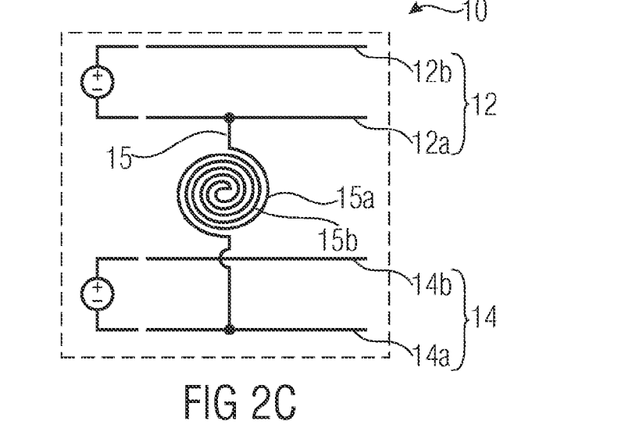

The RF decoupling element 15 may be formed in different ways. FIGS. 2a to 2c show embodiments according to the invention. These embodiments are given by way of illustration only and not by way of limitations. Various substitutions, modifications, additions and/or rearrangements as in the spirit and/or the scope of the underlying inventive concept will become apparent to those skilled in the art from this disclosure.

The RF decoupling element 15 may be formed by at least two line portions 15a and 15b (FIG. 2a, b), which are arranged in parallel to each other. As a consequence a conductive path between the first power supply domain 12 and the second power supply domain 14 may be longer than a shortest possible conductive path or line between the two power supply domains.

As is shown in the FIGS. 2a to 2c an integrated circuit 10 may comprise, for the means of illustration, two power domains 12 and 14. Each of the power supply domains may comprise two portions or potential feed lines 12a, 12b, 14a, and 14b. The portions 12a and 14a may be on the same potential and electrically connected by a RF decoupling element 15.

The RF decoupling element 15 may be formed by line portions, wherein at least two line portions 15a, 15b extend in parallel to each other and which may be partly arranged in a meander-like formation. This can according to an embodiment of the invention mean that a part of the inductive element is formed by a conductive path or line portion, which is coupled between the at least two power supply domains of the integrated circuit and which comprises a meander-like shape.

In the embodiment shown in FIG. 2a, the RF decoupling element comprises a meander-like shape with at least two line portions 15a and 15b extending in parallel to each other. The RF decoupling element, which may be formed as a conductive path between the respective power supply domains may be distributed in one or more semiconductor device layers of a microchip comprising the integrated circuit. Such a semiconductor device layer may be, for example, a metal layer or a poly-silicon layer of the integrated circuit or any other layer needed to form a functional packaged chip with the integrated circuit.

In this context, it should be mentioned that an integrated circuit in a microchip can comprise different integrated circuits fulfilling different tasks of the microchip. These different integrated circuits may comprise different power supply domains and may be seen in the context of this invention as one integrated circuit. This means, for example, an analog digital converter may need a power supply domain different to a power supply of a microcontroller and both are integrated on one chip. Therefore a chip or microchip may comprise a first integrated circuit and at least a second integrated circuit. Each of the first and the second integrated circuit may include at least one power supply domain. The chip may, according to this embodiment, include an RF decoupling element, which is electrically connecting a portion of a power supply domain of the first integrated circuit and a portion of a power supply domain of the second integrated circuit. Both portions may be on the same potential.

Another embodiment (FIG. 2b) shows the RF decoupling element 15 formed as a rectangular-shaped spiral. In this embodiment, RF decoupling element 15 comprises again at least two line portions 15a and 15b extending in parallel to each other.

The same is valid for the embodiment shown in FIG. 2c.

In the embodiment shown in FIG. 2c, the RF decoupling element may be formed by line portions, which are partly arranged in a spiral-like formation or a spiral.

In other embodiments the RF decoupling element may comprise another shape or structure. The exact structure may be chosen in order to adapt the impedance of the electrical connection to the special needs of the integrated circuit. The chosen structure of the RF decoupling element may be different than a shortest possible electrical connection would have.

In this embodiment, the RF decoupling element 15 is formed as a spiral.

It is obvious that a multitude of possibilities exist to form the RF decoupling element 15. The RF decoupling element 15 comprises an impedance, which is higher than the impedance of a shortest possible conductive path or line portion between the first power supply domain 12 and the second power supply domain 14 would have. This means that in embodiments of the invention the impedance of the RF decoupling element 15 may be higher than the impedance of a conductive path, which is, for example, automatically routed by a respective routing software tool and hence optimized in terms of the length of the conductive path.

In a further embodiment of the invention, the inductive element may be a coil connecting a potential feed line of a first power domain and a potential feed line of a second power domain. Both potential feed lines may be again on the same potential. In this embodiment, the inductive element, which is formed by the coil, comprises also at least two line portions of the coil, which are arranged in parallel to each other.

Figure 3A:
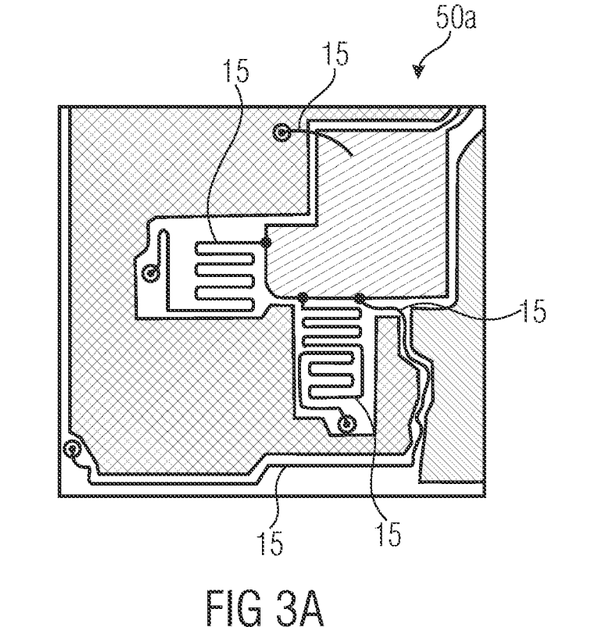
FIGS. 3a and 3b show according to another embodiment of the invention meander-like inductive elements in different metal layers of a microchip.
Figure 3B:
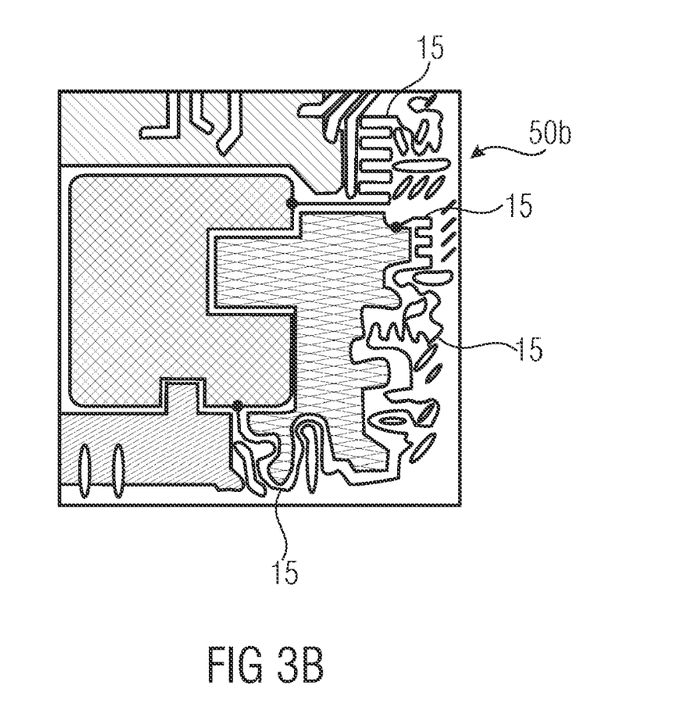

A part of a schematic layout of an integrated circuit is depicted in the embodiments of the invention in FIGS. 3a and 3b. The integrated circuit 10 may comprise a plurality of RF decoupling elements 15 or inductive structures 15 electrically connecting different power supply domains of the integrated circuit. In this embodiment the RF decoupling elements 15 may be distributed in different semiconductor device layers of a microchip comprising the integrated circuit. The microchip may be a microcontroller, for example, wherein the inductive structures 15 are integrated in the chip package and wherein the inductive structures 15 are implemented in a different way (shape) in a different semiconductor device layer of the microcontroller chip. In FIG. 3a, the layout of a first layer 50a of a semiconductor device and in FIG. 3b the layout of a second layer 50b of the semiconductor device are depicted. FIGS. 3a and 3b show that RF or high frequency decoupling elements according to the invention may be provided in different manner in different metal layers. Further details of the layout in FIGS. 3a and 3b are only schematically depicted and to simplify matters not explained in detail.

In embodiments of the invention, the RF decoupling element may be formed as a conductive path in at least a semiconductor device layer of a chip or microchip. The microchip may include the integrated circuit. According to embodiments of the invention, the RF decoupling element can be formed as a conductive path, wherein the length of the conductive path is longer than a shortest possible conductive path between the first power supply domain and the second power supply domain would have.

According to a further embodiment of the invention, the RF decoupling element may be arranged in different layers of a laminated chip package. The RF decoupling element can be implemented in the microchip without significantly increasing the costs for manufacturing. Furthermore, the electrical parameter of the RF decoupling element can be exactly determined, for example, by the chosen length and geometry of the conductive path between the power supply domains. In addition, a low frequency current flow through the package can be achieved, which almost does not load the power supply of the chip.

In embodiments of the invention, the electrostatic discharge robustness as well as the electric overstress robustness of an integrated circuit can be increased and together a high frequency (HF) interference or noise coupling between different power supply domains of the integrated circuit being on the same reference potential can be reduced.

Figure 4:
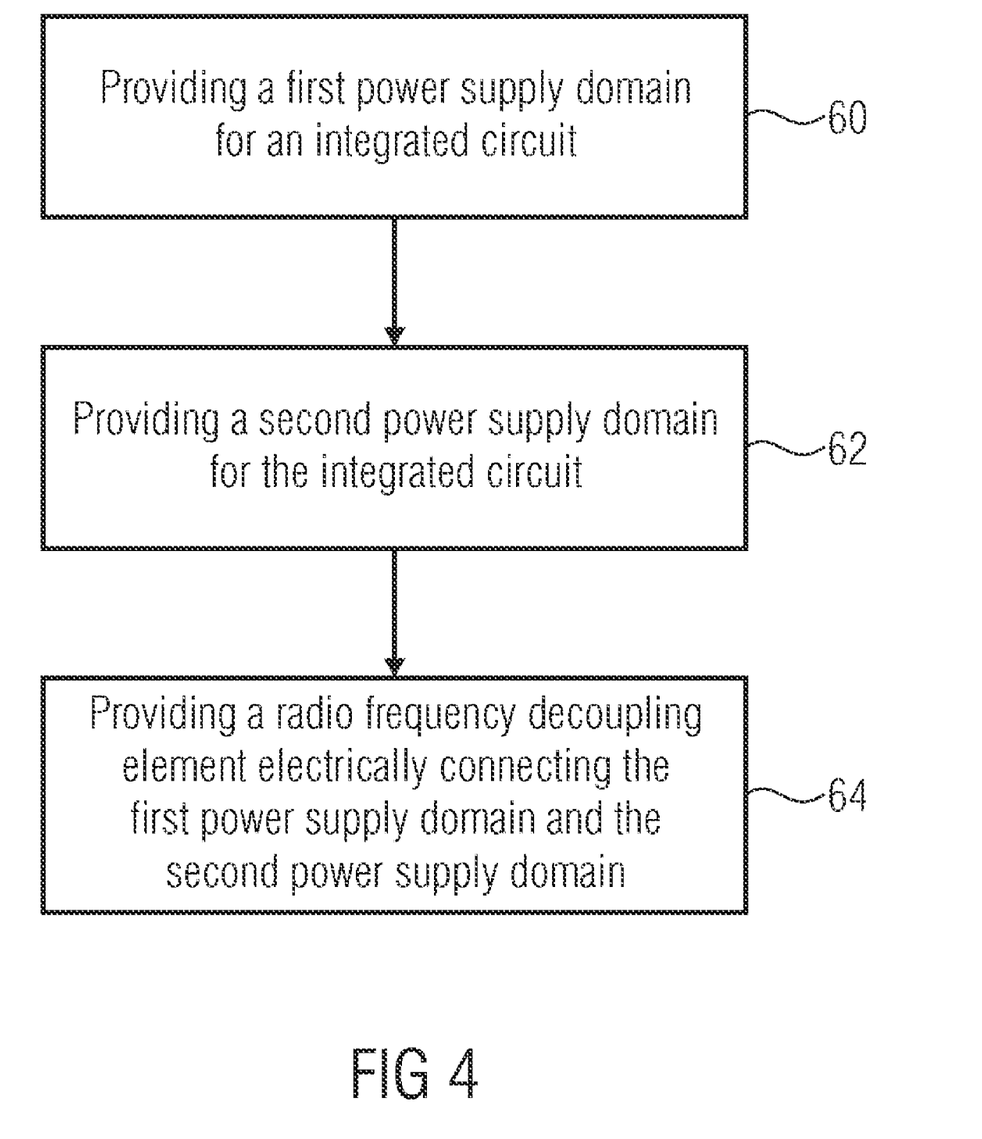
FIG. 4 shows a flow chart of the method for manufacturing an integrated circuit according to an embodiment of the invention.

FIG. 4 shows a flow diagram of an embodiment for the method for manufacturing an integrated circuit. The method comprises providing, in step 60, a first power supply domain of the integrated circuit and providing, in step 62, a second power supply domain of the integrated circuit. Furthermore, the method comprises providing, in step 64, a RF decoupling element, which is electrically connecting the first power supply domain and a second power supply domain According to an embodiment for the method, the providing of a RF decoupling element can be performed by integrating an inductance between a portion of the first power supply domain and a portion of the second power supply domain, both being on the same potential in a chip package of the integrated circuit.

In another embodiment of the method the providing, in step 64, of an RF decoupling element, which is electrically connecting the first power supply domain and the second power supply domain may be performed by forming line portions with at least partly a meander-like structure. Furthermore the providing, in step 64, of an inductive element, which is electrically connected to the different power supply domains, can be performed by forming line portions with at least a partly spiral-like structure.

In an embodiment, an inductance integrated in a laminate package is implemented between different power supply domains of an integrated circuit. Due to this, low impedance electrical connections for a direct current, respectively for a low frequency alternating current, can be achieved. This may be important for the electrostatic discharge robustness and the electrical overstress robustness. The RF decoupling may be formed as an inductance or an inductive element and may prevent or reduce the coupling of a high frequency interference or noise in general from one power supply domain to another power supply domain of the integrated circuit.

While this invention has been described in terms of several embodiments, there are alterations, permeations and equivalents, which fall within the scope of this invention. It should also be noted that there are many alternative ways of implementing the method and compositions of the present invention. It is therefore intended that the following appended claims be interpreted as including all such alternations, permeations and equivalents as falling within the true spirit and scope of the present invention.

What is claimed is:

1. An integrated circuit comprising:
   a first power supply domain;
   at least a second power supply domain; and
   a radio frequency (RF) decoupling element connected between the first power supply domain and the second power supply domain wherein the RF decoupling element is connected between a portion of the first power supply domain and a portion of the second power supply domain;
   wherein the first power supply domain, the second power supply domain, and the RF decoupling element are part of the integrated circuit.

2. The integrated circuit according to claim 1, wherein the portion of the first power supply domain and the portion of the second power supply domain, are on the same potential.

3. The integrated circuit according to claim 1, wherein the RF decoupling element is formed by at least two line portions extending in parallel to each other.

4. The integrated circuit according to claim 1, wherein the RF decoupling element is formed by line portions, partly arranged in a meander-like formation.

5. The integrated circuit according to claim 1, wherein the RF decoupling element is formed by line portions, partly arranged in a spiral-like formation.

6. The integrated circuit according to claim 1, wherein the RF decoupling element is formed as a conductive path in at least one semiconductor device layer of a chip.

7. The integrated circuit according to claim 1, wherein the RF decoupling element is formed as an inductive element integrated in a chip package.

8. The integrated circuit according to claim 2, wherein the potential of the portion of the first power supply domain and the potential of the portion of the second power supply domain is a ground potential.

9. The integrated circuit according to claim 2, wherein the potential of the portion of the first power supply domain and the potential of the portion of the second power supply domain is a potential different to a ground potential.

10. The integrated circuit according to claim 1, wherein the RF decoupling element is formed as an inductive element arranged in different semiconductor device layers of a laminate chip package.

11. The integrated circuit according to claim 1, wherein the RF decoupling element comprises a low pass filter characteristic.

12. An integrated circuit comprising:
    a first power supply domain with a first portion on a first potential and a second portion on a second potential;
    at least a second power supply domain with a third portion on a third potential and a fourth portion on a fourth potential;
    a radio frequency (RF) decoupling element electrically connecting one of the first and the second portion with one of the third and the fourth portion,
    wherein the portions, being electrically connected by the RF decoupling element, are on the same potential; and
    wherein the first power supply domain, the second power supply domain, and the RF decoupling element are part of the integrated circuit.

13. The integrated circuit according to claim 12, wherein the RF decoupling element is formed by conductive line portions, partly arranged in a meander-like formation.

14. The integrated circuit according to claim 12, wherein the RF decoupling element is formed by conductive line portions, partly arranged in a spiral-like formation.

15. A chip comprising:
    a first integrated circuit disposed on said chip;
    at least a second integrated circuit disposed on said chip, each of the first and the second integrated circuits comprising at least one power supply domain;
    a radio frequency (RF) decoupling element electrically connecting a portion of a power supply domain of the first integrated circuit and a portion of a power supply domain of the second integrated circuit, both portions being on the same potential.

16. The chip according to claim 15, wherein the RF decoupling element is formed in at least one semiconductor device layer of the chip.

17. The chip according to claim 15, wherein the RF decoupling element is integrated in a package of the chip.

18. The chip according to claim 15, wherein the RF decoupling element is configured to comprise a low pass filter characteristic.

19. A method for manufacturing an integrated circuit comprising:
   providing a first power supply domain;
   providing at least a second power supply domain; and
   providing a radio frequency (RF) decoupling element electrically connecting the first power supply domain and the second power supply domain so that the radio frequency (RF) decoupling element is connected between a portion of the first power supply domain and a portion of the second power supply domain, wherein the first power supply domain, the second power supply domain, and the RF decoupling element are part of the integrated circuit.

20. The method according to claim 19, wherein the portion of the first power supply domain and the portion of the second power supply domain, are on the same potential.

21. The method according to claim 19, wherein the providing a radio frequency (RF) decoupling element electrically connecting the first power supply domain and the second power supply domain is performed by forming line portions with at least partly a meander-like structure.

22. The method according to claim 19, wherein the providing a radio frequency (RF) decoupling element electrically connecting the first power supply domain and the second power supply domain is performed by forming line portions with at least partly a spiral-like structure.

23. The method according to claim 19, wherein the providing a radio frequency (RF) decoupling element electrically connecting the first power supply domain and the second power supply domain is performed by integrating the radio frequency decoupling element in a chip package of the integrated circuit.

* * * * *